(12) United States Patent
Teng et al.

(10) Patent No.: US 11,355,466 B2
(45) Date of Patent: Jun. 7, 2022

(54) PACKAGE STRUCTURE AND MANUFACTURING METHOD OF PACKAGE STRUCTURE THEREOF

(71) Applicant: Taiwan Semiconductor Manufacturing Co., Ltd., Hsinchu (TW)

(72) Inventors: Po-Yuan Teng, Hsinchu (TW); Hao-Yi Tsai, Hsinchu (TW); Kuo-Lung Pan, Hsinchu (TW); Sen-Kuei Hsu, Kaohsiung (TW); Tin-Hao Kuo, Hsinchu (TW); Yi-Yang Lei, Taichung (TW); Ying-Cheng Tseng, Tainan (TW); Chi-Hui Lai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/897,296

(22) Filed: Jun. 10, 2020

(65) Prior Publication Data

US 2021/0242159 A1    Aug. 5, 2021

Related U.S. Application Data

(60) Provisional application No. 62/968,108, filed on Jan. 30, 2020.

(51) Int. Cl.
*H01L 23/538* (2006.01)
*H01L 23/00* (2006.01)
(Continued)

(52) U.S. Cl.
CPC .......... *H01L 24/24* (2013.01); *H01L 21/4857* (2013.01); *H01L 21/561* (2013.01);
(Continued)

(58) Field of Classification Search
CPC .......... H01L 22/20; H01L 2224/09515; H01L 24/24; H01L 21/4857; H01L 21/561;
(Continued)

(56) References Cited

U.S. PATENT DOCUMENTS 6,081,026 A * 6/2000 Wang ................ H01L 23/49822
257/691
9,000,584 B2    4/2015 Lin et al.
(Continued)

*Primary Examiner* — Kyoung Lee
*Assistant Examiner* — Christina A Sylvia
(74) *Attorney, Agent, or Firm* — JCIPRNET

(57) ABSTRACT

A package structure including at least one semiconductor die and a redistribution structure is provided. The semiconductor die is laterally encapsulated by an encapsulant, and the redistribution structure is disposed on the semiconductor die and the encapsulant and electrically connected with the semiconductor die. The redistribution structure includes signal lines and a pair of repair lines. The signal lines include a pair of first signal lines located at a first level, and each first signal line of the pair of first signal lines has a break that split each first signal line into separate first and second fragments. The pair of repair lines is located above the pair of first signal lines and located right above the break. Opposite ending portions of each repair line are respectively connected with the first and second fragments with each repair line covering the break in each first signal line.

20 Claims, 14 Drawing Sheets

(51) Int. Cl.
*H01L 23/31* (2006.01)
*H01L 21/56* (2006.01)
*H01L 21/48* (2006.01)
*H01L 21/683* (2006.01)

(52) U.S. Cl.
CPC ........ *H01L 21/565* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 2221/68345* (2013.01); *H01L 2221/68359* (2013.01); *H01L 2224/24137* (2013.01)

(58) Field of Classification Search
CPC ............... H01L 21/565; H01L 21/6835; H01L 23/3128; H01L 23/5383; H01L 23/5386; H01L 24/19; H01L 2221/68345; H01L 2221/68359; H01L 2224/24137; H01L 22/34; H01L 24/20; H01L 2223/6638; H01L 23/5382; H01L 21/568; H01L 2221/68372; H01L 2224/04105; H01L 2224/12105; H01L 2924/18162

See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2015/0179616 A1* | 6/2015 | Lin ........................ H01L 24/19 257/773 |
| 2018/0090445 A1* | 3/2018 | Chang ................. H01L 23/3128 |

\* cited by examiner

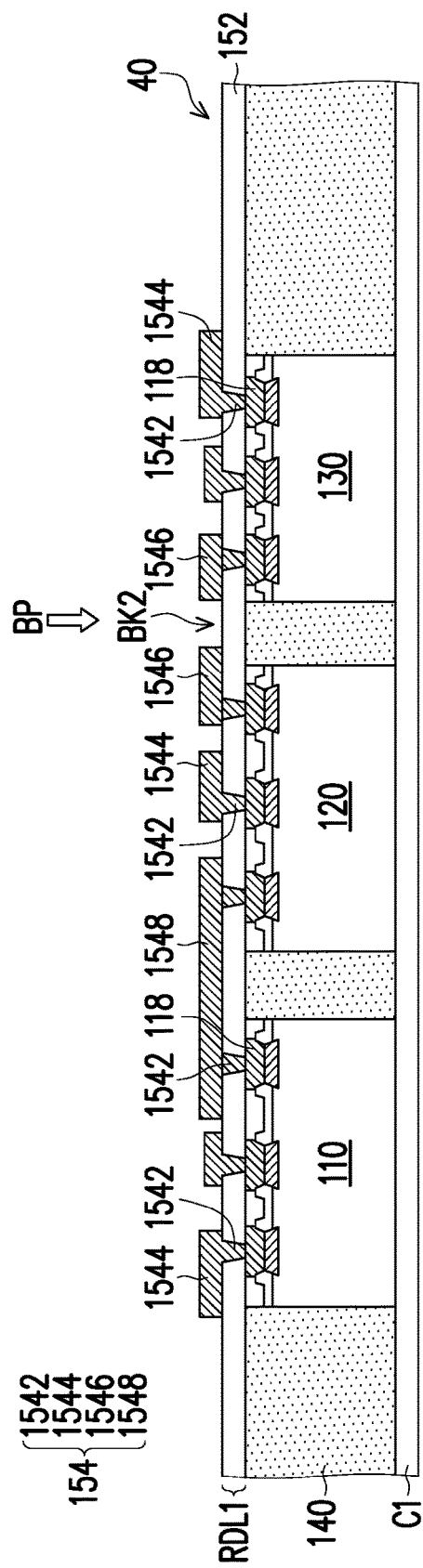
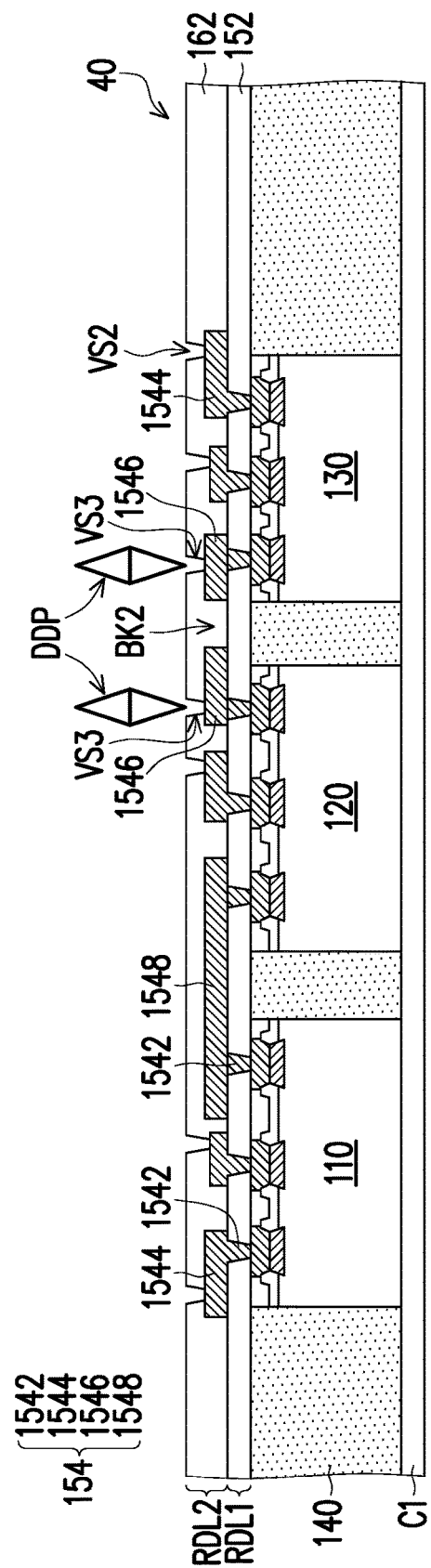
FIG. 3
FIG. 4

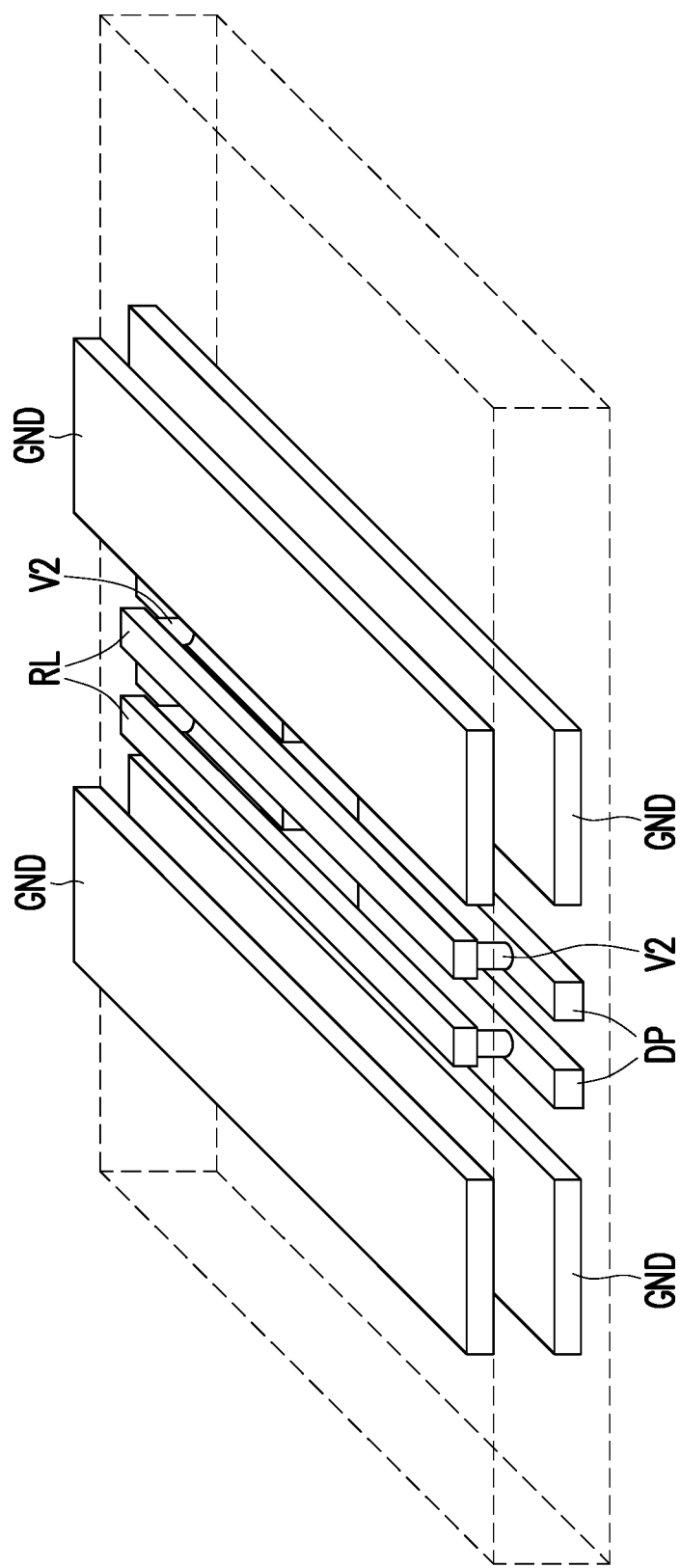

PACKAGE STRUCTURE AND MANUFACTURING METHOD OF PACKAGE STRUCTURE THEREOF

CROSS-REFERENCE TO RELATED APPLICATION

This application claims the priority benefit of U.S. provisional application Ser. No. 62/968,108, filed on Jan. 30, 2020. The entirety of the above-mentioned patent application is hereby incorporated by reference herein and made a part of this specification.

BACKGROUND

Wafer-level packaging (WLP) involves packaging the dies on the wafers as wafer scale structures. Such packaging technology is suitable for packaging a large amount of semiconductor devices into large-scale or super large-scale packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 7 are schematic cross-sectional views showing various stages of the manufacturing method for forming the package structure according to some embodiments of the present disclosure.

FIG. 11A and FIG. 11B respectively illustrate a schematic three-dimensional view and a cross-sectional view showing a repair structure relative to the location of the broken line(s) in accordance with some embodiments of the present disclosure.

DETAILED DESCRIPTION

Figure 1:
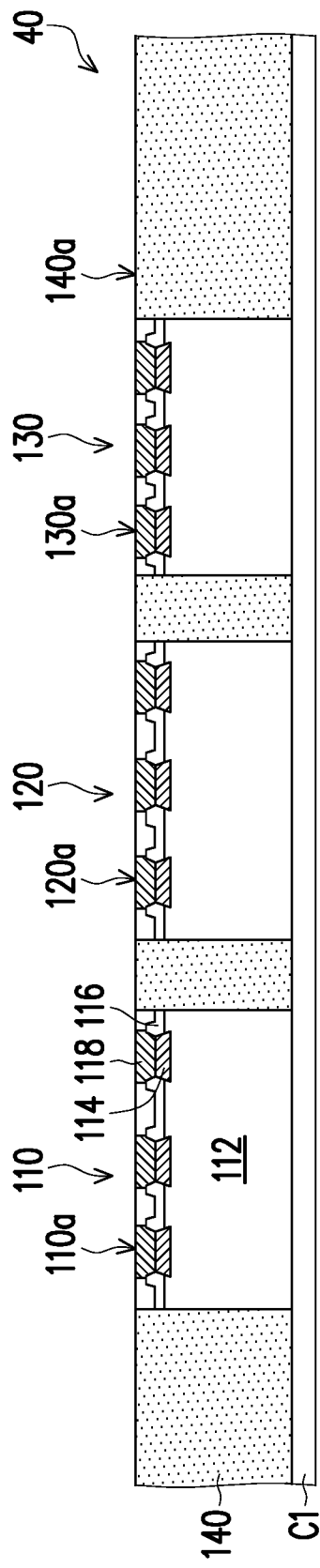

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The specific embodiment(s) discussed herein is merely illustrative and is related to a package structure or assembly, and does not limit the scope of the present disclosure. Embodiments of the present disclosure describe the exemplary manufacturing process of wafer-level packaging and the package structures fabricated there-from. Certain embodiments of the present disclosure are related to the package structures formed with wafer bonding structures and stacked wafers and/or dies. The wafers or dies may include one or more types of integrated circuits or electrical components on a bulk semiconductor substrate or a silicon/germanium-on-insulator substrate. The embodiments are intended to provide further explanations but are not used to limit the scope of the present disclosure.

For super large packages or multiple die packages, the production yield is important. Open defects or broken wiring lines may occur during the fabrication of large packages, which significantly lower the yield and increase the production costs. In addition to provide redundancy circuit for the possibly occurred broken wiring lines, one applicable approach is to repair the open defects in the wiring lines in order to improve the yield of the products.

FIGS. 1-7 illustrate the cross-sectional views showing various stages of the manufacturing methods for forming the package structure according to some embodiments of the present disclosure. In FIG. 1, in some embodiments, a carrier C1 is provided. In some embodiment, the carrier C1 may be a glass carrier, a semiconductor wafer or any suitable carrier for the manufacturing method of the packages. In some embodiments, a debond layer (not shown) may be provided on the carrier C1, and the material of the debond layer may be any material suitable for bonding and debonding the carrier C1 from the above layer(s) or any structure thereon. In some embodiments, the debond layer may include a release layer (such as a light-to-heat conversion ("LTHC") layer).

In FIG. 1, in some embodiments, semiconductor dies 110, 120, 130 are disposed on the carrier C1. In some embodiments, the semiconductor die 110 includes a semiconductor substrate 112, a plurality of contact pads 114 and a passivation layer 116. The contact pads 114 may be formed on a surface of the semiconductor substrate 112, the passivation layer 116 covers the surface of the semiconductor substrate 112 but the contact pads 114 are exposed from the passivation layer 116. In some embodiments, die connectors 118 are connected to the contact pads 114, and may be used to connect the semiconductor die 110 to other devices or components. In some embodiments, the surface of the semiconductor die 110 where the die connectors 118 are exposed is referred to as an active surface 110a.

In some embodiments, the semiconductor substrate 112 may be made of semiconductor materials, such as semiconductor materials of the groups III-V of the periodic table. In some embodiments, the semiconductor substrate 112 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 112 may include silicon on insulator (SOI) or silicon-germanium on insulator (SGOI). In some embodiments, the semiconductor substrate 112 includes active components (e.g., transistors or the like) and optionally passive components (e.g., resistors, capacitors, inductors, or the like) formed therein. In certain embodiments, the contact pads 114 include aluminum pads, copper pads, or other suitable metal pads. In some embodiments, the passivation layer 116 may be a single layer or a multi-layered structure, including a silicon oxide layer, a silicon nitride layer, a silicon oxy-nitride layer, a dielectric layer formed by other suitable dielectric materials or combinations thereof. In some embodiments, the die connectors 118 includes copper, copper alloys, or other conductive materials, and may be formed by deposition, plating, or other suitable techniques. In some embodiments, the die connectors 118 are prefabricated structures attached over the contact pads 114. In some embodiments, the die connectors 118 are solder balls, metal pillars, controlled collapse chip connection (C4) bumps, micro bumps, bumps formed via electroless nickel-electroless palladium-immersion gold technique (ENEPIG), combination thereof (e.g, a metal pillar with a solder ball attached), or the like. In some embodiments, similar structural features as the ones just discussed for the semiconductor die 110 may be found in the other semiconductor dies (for example, in the semiconductor dies 120, 130 shown in FIG. 1).

In FIG. 1, it is seen that three semiconductor dies 110, 120, 130 are disposed side by side and are spaced apart from each other with a distance. It is understood that the number(s) of the semiconductor dies is not limited to the embodiments herein. For example, the amounts of the semiconductor dies 110, 120, 130 may be different, and the semiconductor dies 110, 120, 130 may be arranged in arrays. In some embodiments, some of the semiconductor dies 110, 120, 130 may have different functions or include chips of different functions. In some embodiments, some of the semiconductor dies 110, 120, 130 may have the same function or include chips of the same function. In some embodiments, the dies 110, 120 includes one or more memory chips, such as high bandwidth memory chips, dynamic random access memory (DRAM) chips or static random access memory (SRAM) chips. In some embodiments, the die 130 may include one or more of an application-specific integrated circuit (ASIC) chip, an analog chip, a sensor chip, a wireless application chip (such as a Bluetooth chip or a radio frequency chip) or a voltage regulator chip. In some embodiments, the dies 110, 120 may be a memory die including memory chips, and the die 130 may be a system-on-chip (SoC) die including a controller chip.

Referring to FIG. 1, in some embodiments, an insulating encapsulant 140 is formed over the carrier C1, and the insulating encapsulant 140 laterally wraps around the semiconductor dies 110, 120, 130. In some embodiments, the insulating encapsulant 140 is formed by forming an molding material (not shown) encapsulating the dies 110, 120, 130 (covering the top surfaces and sidewalls of the dies 110, 120, 130) and filling up the gaps between the dies 110, 120, 130, and then the molding material is removed through a planarization process until the die connectors 118 of the dies 110, 120, 130 are exposed. By removing portions of the molding material above the top surfaces (active surfaces) 110a, 120a, 130a of the dies 110, 120, 130, the insulating encapsulant 140 is obtained and a molded structure 40 is formed. The molded structure 40 may be considered as a reconstructed wafer. In some embodiments, the insulating encapsulant 140 is formed of an epoxy resin molding compound using the mold underfill (MUF) process. After planarization, the top surfaces 110a, 120a, 130a of the dies 110, 120, 130 are coplanar and levelled with the top surface 140a of the encapsulant 140. That is, the active surfaces 110a, 120a, 130a of the dies 110, 120, 130 are exposed from the planarized encapsulant 140. In FIG. 1, the encapsulant 140 laterally wraps around the dies 110, 120, 130 and is located between the facing sidewalls of the adjacent dies. In some embodiments, the planarization process includes a chemical-mechanical polishing (CMP) process, a mechanical grinding process, a fly cutting process or an etching back process. In some embodiments, the planarization process includes a CMP process.

Following the formation of the molded structure 40, a redistribution structure having multiple wiring layers or redistribution layers stacked together is formed. According to some embodiments of the present disclosure, the following wiring layer is utilized to repair the open defects of the broken wiring lines in the identified wiring layer, and a new circuit loop is generated.

Figure 2:
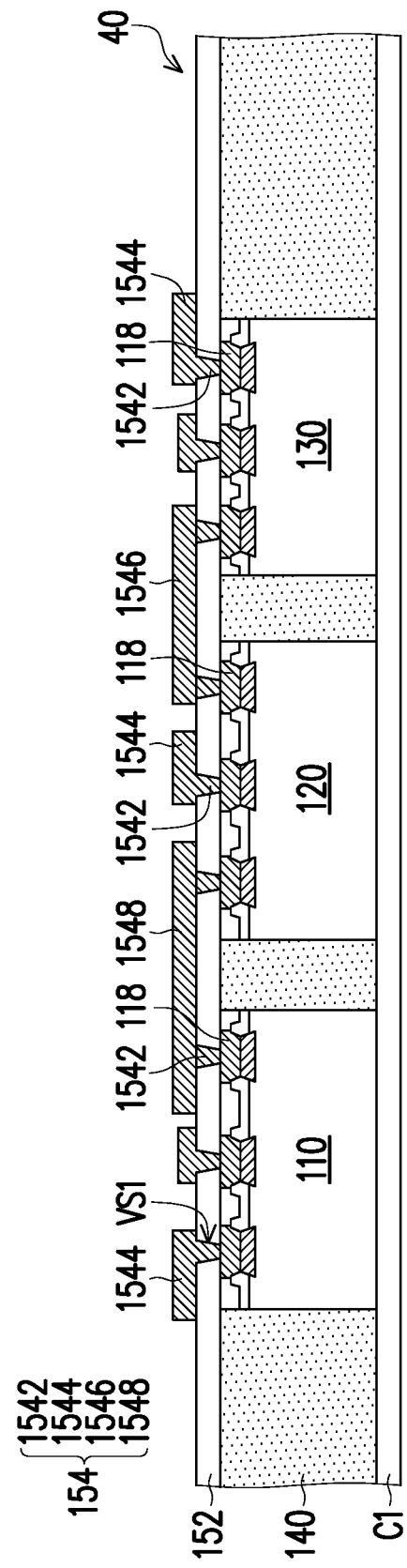

Referring to FIG. 2, in some embodiments, a first dielectric layer 152 is formed over the molded structure 40, covering the encapsulant 140 and the semiconductor dies 110, 120, 130. For example, the first dielectric layer 152 may be formed by a coating process such as spin-coating process, a lamination process or a deposition process including a chemical vapor deposition (CVD) process. In certain embodiments, the first dielectric layer 152 may be a photo-sensitive material layer. In some embodiments, a material of the first dielectric layer 152 may include polyimide, benzocyclobutene (BCB), polybenzooxazole (PBO), or any suitable photo-sensitive polymer materials or other photoresist materials. In certain embodiments, the first dielectric layer 152 may include an organic polymeric material layer. In alternative embodiments, the first dielectric layer 110 may include an inorganic dielectric material layer. In some embodiments, the first dielectric layer 152 is a single-layered structure. In some embodiments, the first dielectric layer 152 is a multi-layered structure.

Referring to FIG. 2, in some embodiments, the first dielectric layer 152 is formed with openings VS1. In some embodiments, some or all of the via openings VS1 expose the die connectors 118 of the dies 110, 120, 130. Later, conductive patterns 154 are formed on the first dielectric layer 152 and fill up the via openings VS1. In some embodiments, the conductive patterns 154 include vias 1542 filled in the via openings VS1, routing lines 1544, signal lines 1546 and a ground plane 1548. In some embodiments, the formation of the conductive patterns 154 includes forming a mask pattern (not shown) on the first dielectric layer 152 exposing the via openings VS1, forming a first metal layer (not shown) over the mask pattern and the first dielectric layer 152 filling up the via openings VS1 and the space or gaps in the mask pattern, and then removing the mask pattern. In some embodiments, the formation of the first metal layer includes forming a conformal seed layer (not shown) such as a titanium/copper layer by sputtering and then forming a copper layer or a copper alloy layer (not shown) on the seed layer by electroplating to fill up the via openings VS1 and fill the gaps or openings in the mask pattern. In some embodiments, the gaps or openings in the mask pattern are located directly above the via openings VS1 and are jointed with the via openings VS1. It is shown in FIG. 2, the routing lines 1544, the signal lines 1546 and the ground plane 1548 are connected to the die connectors 118 of the semiconductor dies 110, 120, 130 through the vias 1542 therebetween. The conductive patterns 154 are electrically connected with the semiconductor dies 110, 120, 130. In certain embodiments, a planarization process may be performed to remove the extra first metal layer above the mask pattern before removing the mask pattern. In some embodiments, the conductive patterns 154 are formed through a CVD process, an electrochemical plating (ECP) process, a sputtering process or the combination thereof. However, it is appreciated that the scope of this disclosure is not limited to the materials and descriptions disclosed above. In some embodiments, the conductive patterns 154 and the underlying first dielectric layer 152 together are referred to as the first redistribution layer RDL1. The RDL1 is considered as the first level of the redistribution structure.

Figure 8:
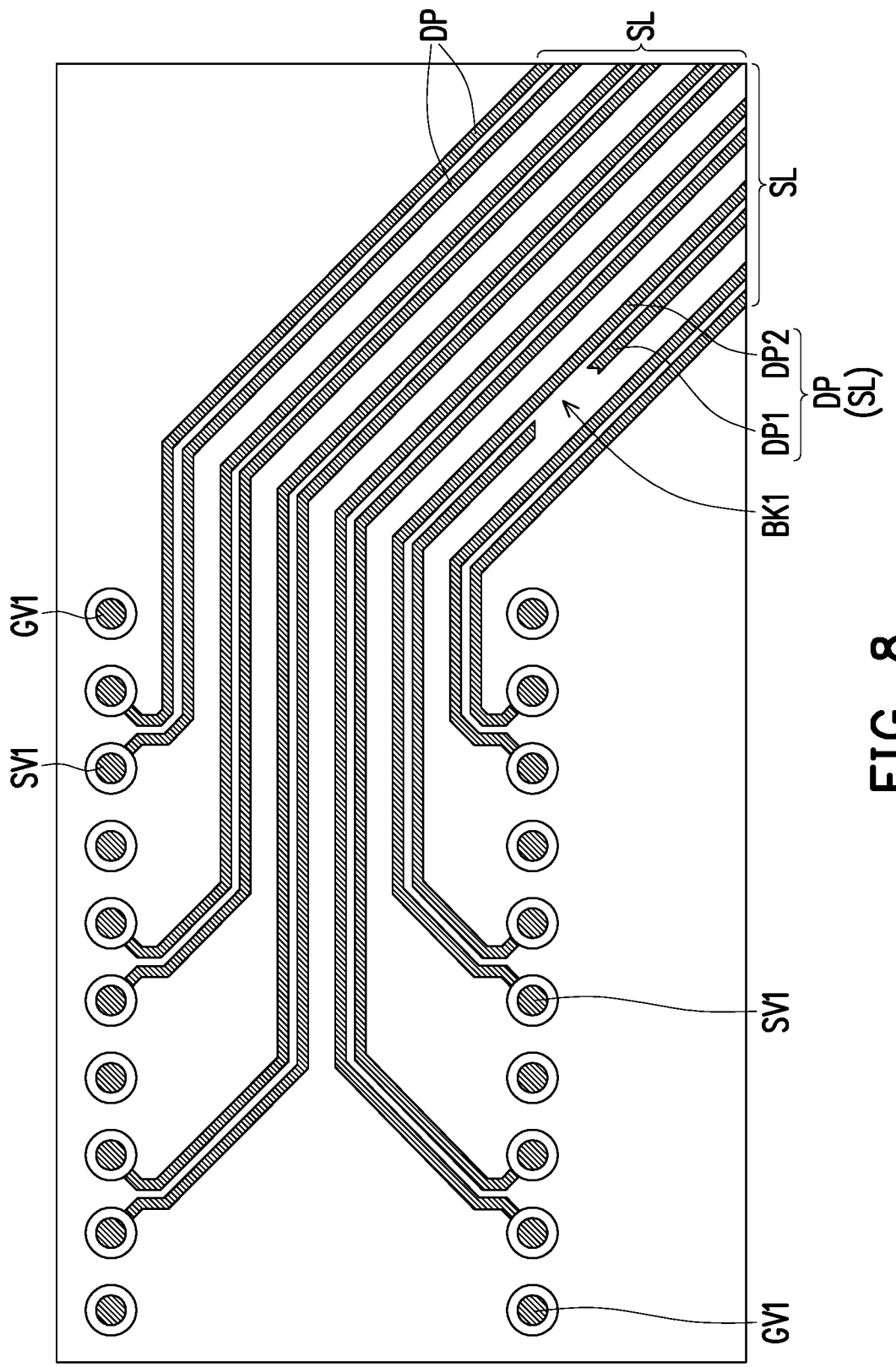
FIGS. 8-10 are schematic top views of a portion of the conductive patterns according to some embodiments of the present disclosure.
Figure 9:
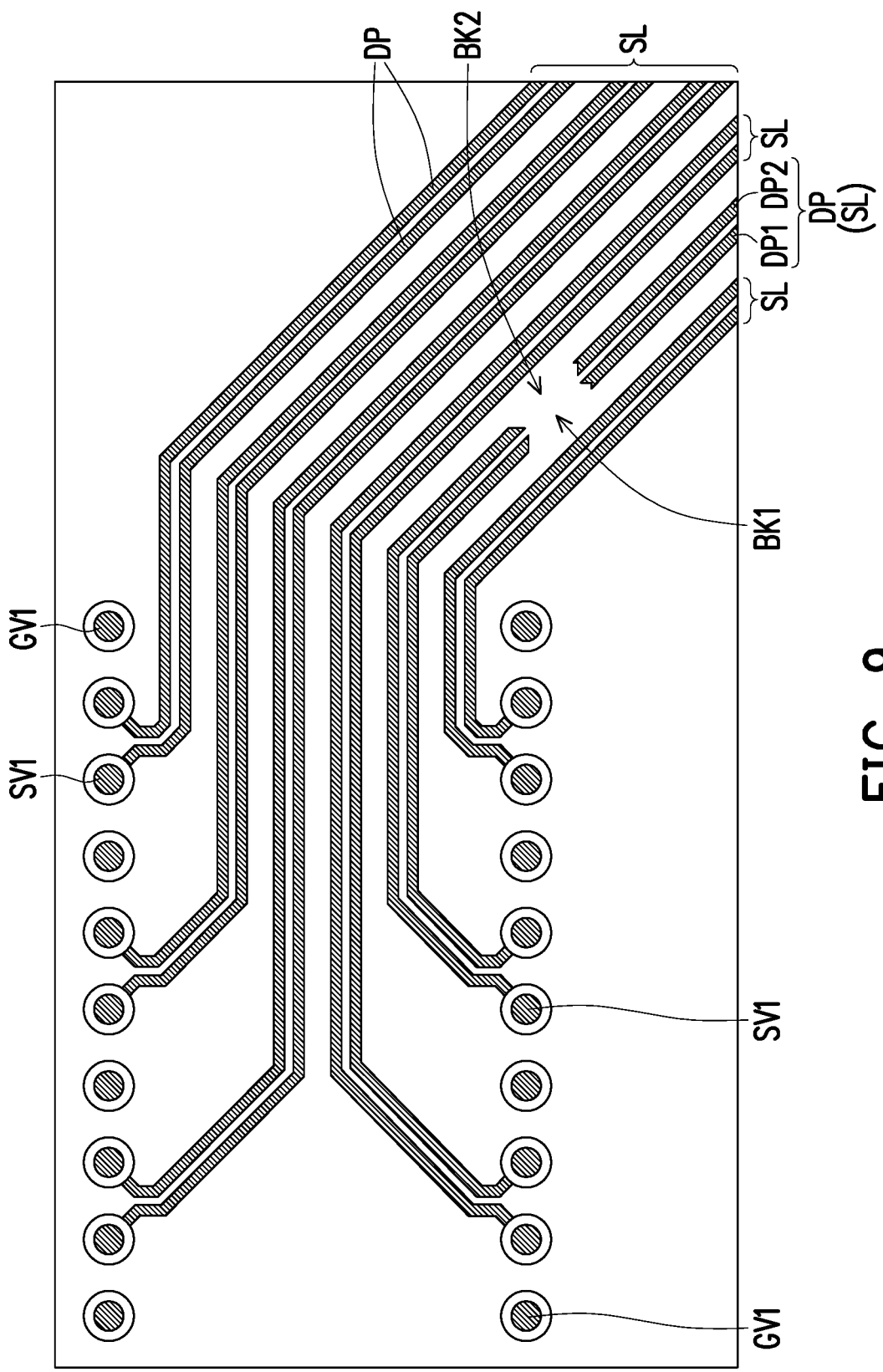
Figure 10:
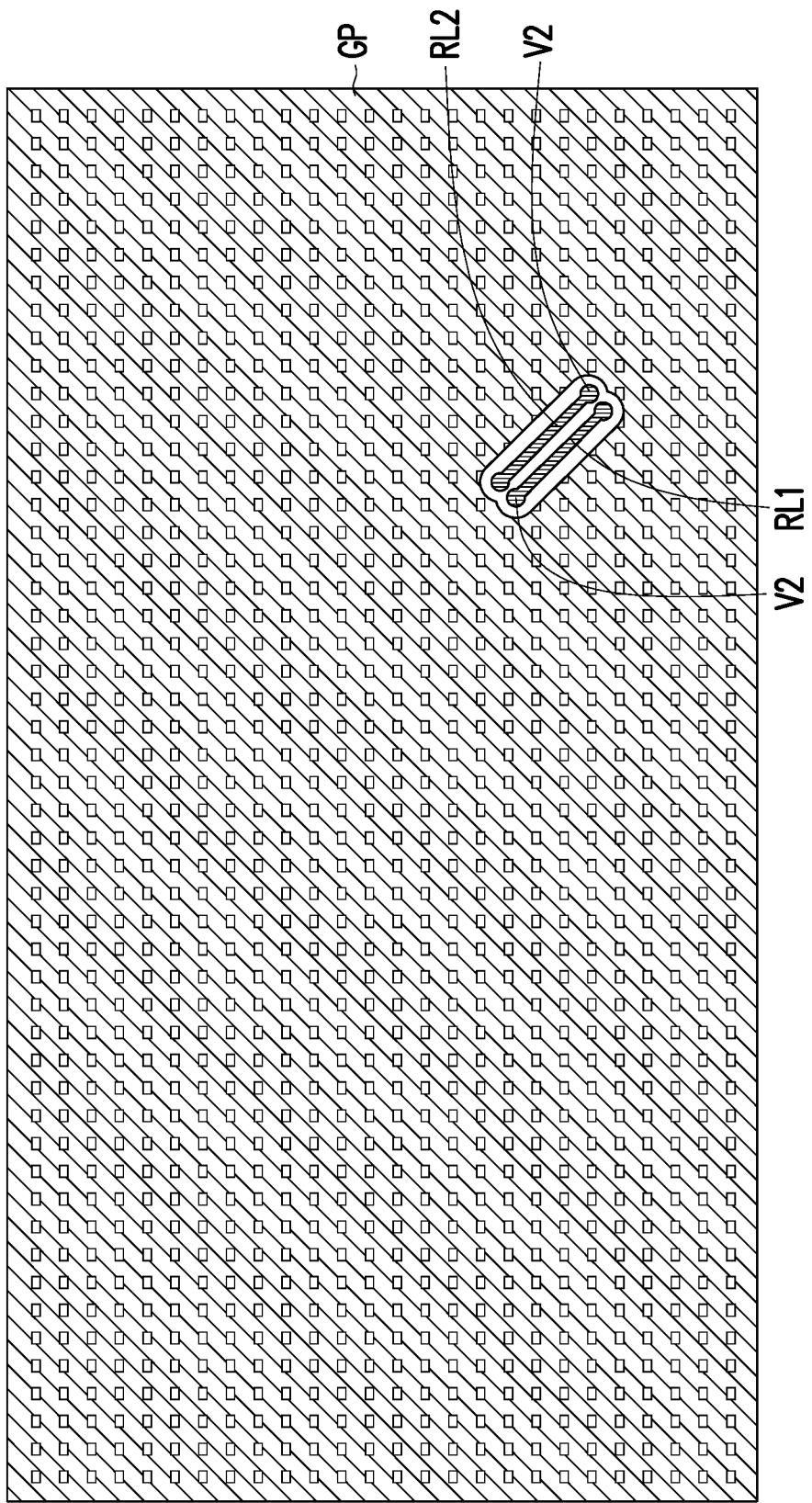

FIGS. 8-10 illustrate schematic top views of a portion of the conductive patterns according to some embodiments of the present disclosure. The signal lines and vias in FIGS. 8-9 may be similar to the signal lines 1546 and vias 1542 that are parts of conductive patterns 154 as described in the above contexts in a redistribution structure or an interconnection structure. It is understood that the configurations and shapes of the signal lines and vias may be different according to various embodiments of the present disclosure. In some embodiments, as see FIG. 8, the signal lines SL includes dual lines or differential pair signal lines DP. The differential pair signal lines DP are configured as a pair of signal lines spaced apart with a distance and extending in parallel, and are employed in differential signaling. In some embodiments, the differential pair signal lines DP are connected with vias SV1 at ending positions for upper- or lower-layer connection. In FIG. 8, ground vias GV1 are formed for further connection to the ground plane. During the formation of the signal lines, it is possible that one of the pair of differential pair signal lines DP is broken. In FIG. 8, in one embodiment, one signal line DP1 of the pair of the differential pair signal lines DP is broken, while the other signal line DP2 of the pair of the differential pair signal lines DP is unbroken. That is, the signal line DP1 is split into two fragments separate with a gap or a break BK1, which leads to an open line or an open circuit. For example, the breakage or fracture of the signal line DP1 may be caused by the stress endured during the thermal process or the planarization process (i.e. the undesired results of process unforeseen factors).

Referring to FIG. 3 and FIG. 9, in some embodiments, a breakage process BP is performed to break (i.e. split or fracture) a certain signal line. In FIG. 9, the breakage process BP is performed to the unbroken signal line DP2 of the pair of the differential pair signal lines DP, so that the signal line DP2 is broken at a location next to or adjacent to the broken location (the location where the break BK1 occurs) of the signal line DP1. In FIG. 9, the location of the break BK2 in the broken signal line DP2 is next to the location of the break BK1, and the size of the break BK2 is substantially about the same as the size of the break BK1. In some embodiments, in FIG. 3 and FIG. 9, the breakage process BP includes performing a laser ablation process to split the signal line DP2 into two fragments separate with the break BK2. In some embodiments, the breakage process BP includes performing an anisotropic etching process to disrupt the signal line DP2. In some embodiments, the breakage process BP includes performing an isotropic etching process to disrupt the signal line DP2. In general, this breakage process BP is performed after the formation of the signal lines of the conductive patterns, especially after the pattern checking process. In some embodiments, the pattern checking process is performed through an optical method before the formation of the following dielectric layer. Following the pattern checking process, if any signal line(s) of the pair of the differential pair signal lines is found to be broken or damaged and the breakage process BP is needed, the breakage process BP shall be performed and then followed by a repairing process. In some embodiments, if both signal lines of the pair of the differential pair signal lines become broken but the broken sites (the break locations) of both signal lines of the pair are not adjacent or the sizes of the break for both signal lines of the pair are very different, then the breakage process BP is performed to either one or both signal lines of the pair of the differential pair signal lines to even out the differences. On the other hand, if both signal lines of the pair of the differential pair signal lines become broken and are broken at adjacent locations (similar to FIG. 9), then the breakage process may be skipped and the subsequent repairing process may be performed.

Referring to FIG. 4, in some embodiments, a second dielectric layer 162 is formed over the molded structure 40, covering the first dielectric layer 152 and the conductive patterns 154. Referring to FIG. 4, in some embodiments, the second dielectric layer 162 is formed with via openings VS2. The material(s) and the methods used for forming the second dielectric layer 162 are similar to those material and methods for forming the first dielectric layer 152, and the details will not be repeated herein for simplicity. In some embodiments, some or all of the via openings VS2 expose the routing lines 1544 of the underlying conductive patterns 154. In certain embodiments, the signal lines 1546 may be covered by the second dielectric layer 162 except at the ending positions.

Referring to FIG. 4, a repairing process is performed, when any signal line(s) of the pair of the differential pair signal lines is checked with one or more breaks (i.e. broken or damaged) in the pattern checking process. Referring to FIG. 4, for the repairing process, a drilling process DDP is performed to the second dielectric layer 162 to form via openings VS3 above the signal line(s) 1546 having the break BK2. In one embodiment, the second dielectric layer 162 is firstly formed with the via openings VS2 (i.e. without the via openings VS3) through the photolithographic and etching process, and the second dielectric layer 162 is later drilled to form the via openings VS3. By doing so, the pattern of the photomask needs not to be adjusted, and the locations of the later formed via openings VS3 may be flexibly adjusted based on the results of the pattern checking process. In some embodiments, the via openings VS3 are formed vertically and directly above both signal lines of the pair of the differential pair signal lines with breaks. For example, the drilled via openings (i.e. via openings VS3) are used to accommodate the later formed vias for connecting the repair lines with the broken signal lines. In some embodiments, at least one via opening VS3 is formed right above each of the two separate segments of the broken signal line 1546. In one embodiment, the drilling process DDP includes a laser drilling process. After the drilling process DDP, the via openings VS3 are formed in the second dielectric layer 162 to expose the separate segments of the underlying broken signal line(s) 1546. Following the drilling process, the repairing process further includes forming repair lines connected to the broken signal lines to reconnect (i.e. repair) the broken signal lines.

Figure 5:
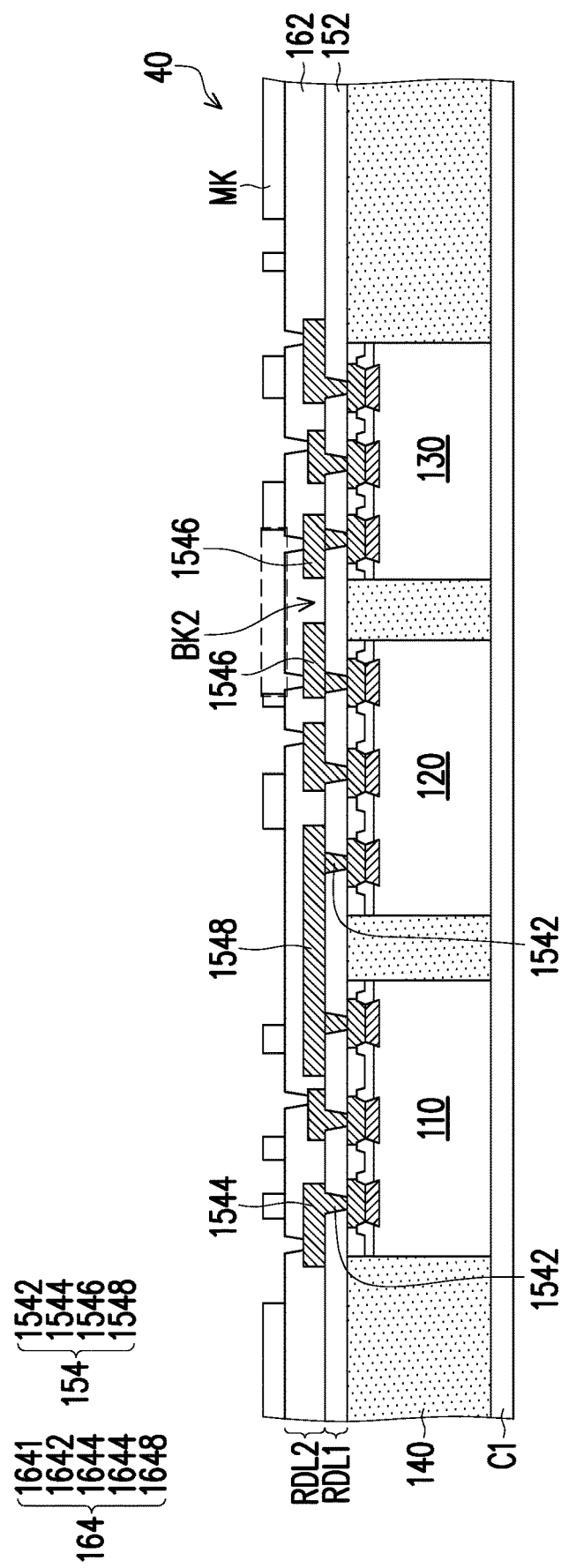
Figure 6:
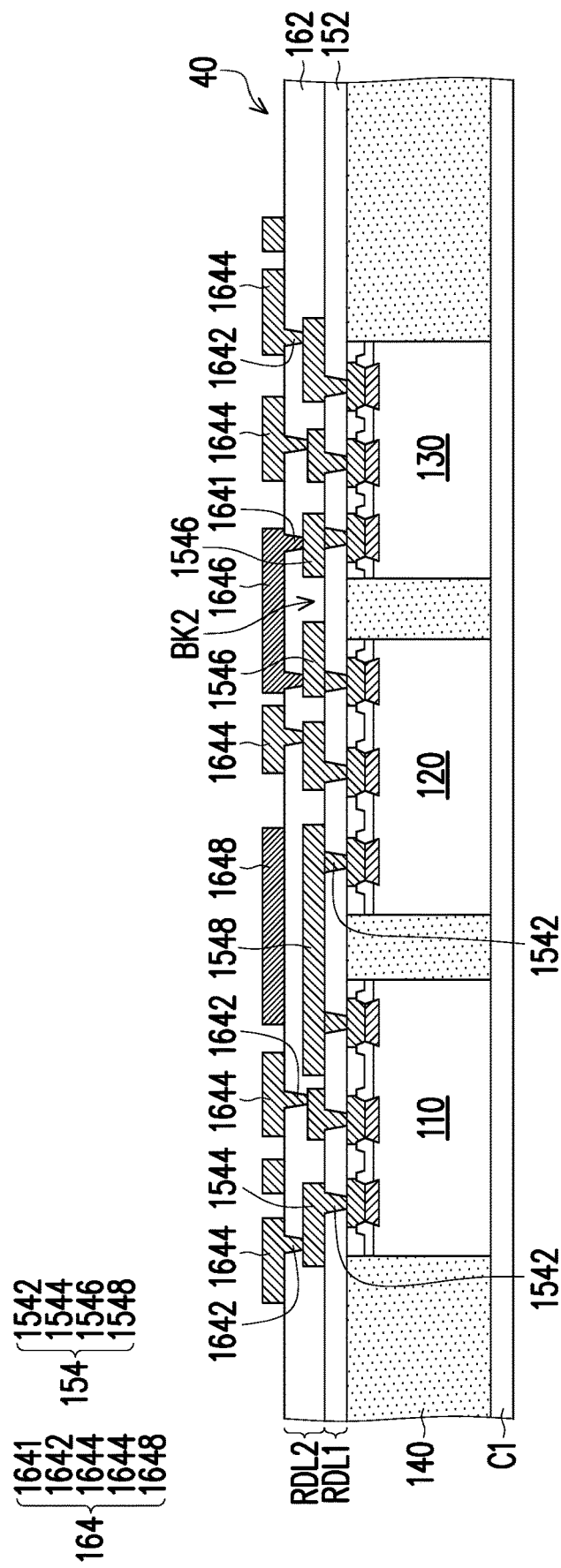

Referring to FIG. 5 and FIG. 6, a mask pattern MK is formed over the second dielectric layer 162 and conductive patterns 164 are formed on the second dielectric layer 162 within the openings of the mask pattern MK. In some embodiments, in FIG. 6, the conductive patterns 164 include vias 1642 filled in the via openings VS2, routing lines 1644, and a ground plane 1648. In some embodiments, the conductive patterns 164 are formed with vias 1641 filled in the via openings VS3 and at least one repair line 1646 on the second dielectric layer 162 and connected with the vias 1641. In some embodiments, the mask pattern MK is formed on the second dielectric layer 162 exposing the via openings VS2 and the locations predetermined for the later formed routing lines 1644 and ground plane 1648. For example, the mask pattern MK may be formed by forming a photoresist material over the second dielectric layer 162, exposing the photoresist material and developing the photoresist material to the mask pattern MK. In some embodiments, the mask pattern MK is originally formed to covers the location(s) for the later formed repair line(s) 1646 but later an etching process is performed to remove portions (represented by the dotted line) of the mask pattern MK so as to expose the underling via openings VS3 and the locations predetermined for the repair lines) 1646.

Referring to FIG. 6, the formation of the conductive patterns 164 includes forming a metal layer (not shown) over the mask pattern MK and the second dielectric layer 162 filling up the via openings VS3 and VS2 and the space predetermined for the later formed routing lines 1644, ground plane 1648 and repair line(s) 1646 in the mask pattern MK, and then removing the mask pattern MK. In some embodiments, the formation of the first metal layer includes forming a conformal seed layer (not shown) such as a titanium/copper layer by sputtering and then forming a copper layer or a copper alloy layer (not shown) on the seed layer by electroplating to fill up the via openings VS1 and fill the gaps or openings in the mask pattern. Through the formation of the conductive patterns 164 after the drilling process, the repair lines connected to the broken signal lines are formed to reconnect (i.e. repair) the broken signal lines. The material(s) and the methods used for forming the conductive patterns 164 are similar to those material and methods for forming conductive patterns 154, and the details will not be repeated herein for simplicity.

In alternative embodiments, the conductive patterns 164 may be formed through more than one mask patterns. For example, the vias 1642, the routing lines 1644 and the ground plane 1648 are formed through the first mask pattern (not shown) with openings exposing the underlying via openings VS2 and the predetermined locations for the routing lines and the ground plane, but covering the via openings VS3 and the predetermined locations for the repair lines. After the formation of the vias 1642, the routing lines 1644 and the ground plane 1648 and the removal of the first mask pattern, the second mask pattern (not shown) is formed with openings exposing the underlying via openings VS3 and the predetermined locations for the repair lines, and then the vias 1641 and the repair lines 1646 are formed. In some embodiments, the conductive patterns 164 and the underlying second dielectric layer 162 together are referred to as the second redistribution layer RDL2. The RDL2 is considered as the second level, located above the first level, of the redistribution structure.

Referring to FIG. 10, the conductive patterns including the ground plane GP and the repair lines RL1-RL2 are formed. The repair lines RL1-RL2 and vias V2 in FIG. 10 are similar to the repair lines 1646 and vias 1641 that are parts of conductive patterns 164 as described in the above contexts in a redistribution structure or an interconnection structure. The locations of the repair lines RL1, RL2 are respectively located right about the broken signal lines DP1, DP2 and the repair lines RL1, RL2 extend over and across the breaks BK1, BK2. Through the vias V2 connected to the underlying separate segments of the broken signal lines DP1, DP2, each of the repair lines RL1, RL2 functions like a bridge to connect the two separate segments of the broken signal line(s) DP1, DP2. With the existence of the repair lines RL1, RL2, the broken signal lines are repaired and the signals can be transmitted from one end of the signal line through the repair line to the other end of the signal line. From the schematic top views shown in FIGS. 8-10, the repair lines RL1, RL2 are formed as a repair pair corresponding to the underlying pair of the differential pair signal lines, and the repair lines RL1, RL2 extend across and beyond the underlying breaks BK1, BK2 and connect the separate segments of the underlying broken signal lines through the vias V2.

For example, the repair pair may be designed to have a line width or critical dimension similar or substantially equivalent to the line width or critical dimension of the underlying signal lines (the differential pair signal lines). In some embodiments, the pair of the repair lines (repair pair) are formed from the next (upper) wiring layer or the conductive patterns of the later formed redistribution layer. For example, the differential pair signal lines may be designed to have ground planes arranged right above, below and beside the signal lines. When there is a need for forming the repair lines, a certain region of predetermined pattern of the ground plane in the following redistribution layer may be formed into the repair pair right above the open defect (the break) of the signal lines.

It is understood that the length, width and location of the repair lines of the repair pair may vary depending on the size of the break(s) or fracture of the signal line(s). Also, the repair lines shall satisfy the design requirements (e.g. the impedance matching) between the repair pair and the differential pair. From the top view, the locations of the repair lines of the repair pair are substantially vertically aligned respectively with the locations of the underlying differential pair signal lines in the width direction (perpendicular to the extending direction, i.e. the length direction, of the signal line). Also, from the top view, the repair lines of the repair pair are vertically fully overlapped with the locations of the breaks in the broken signal lines in the length direction, and the repair lines are long enough to fully cover the breaks in the broken signal lines.

Figure 7:
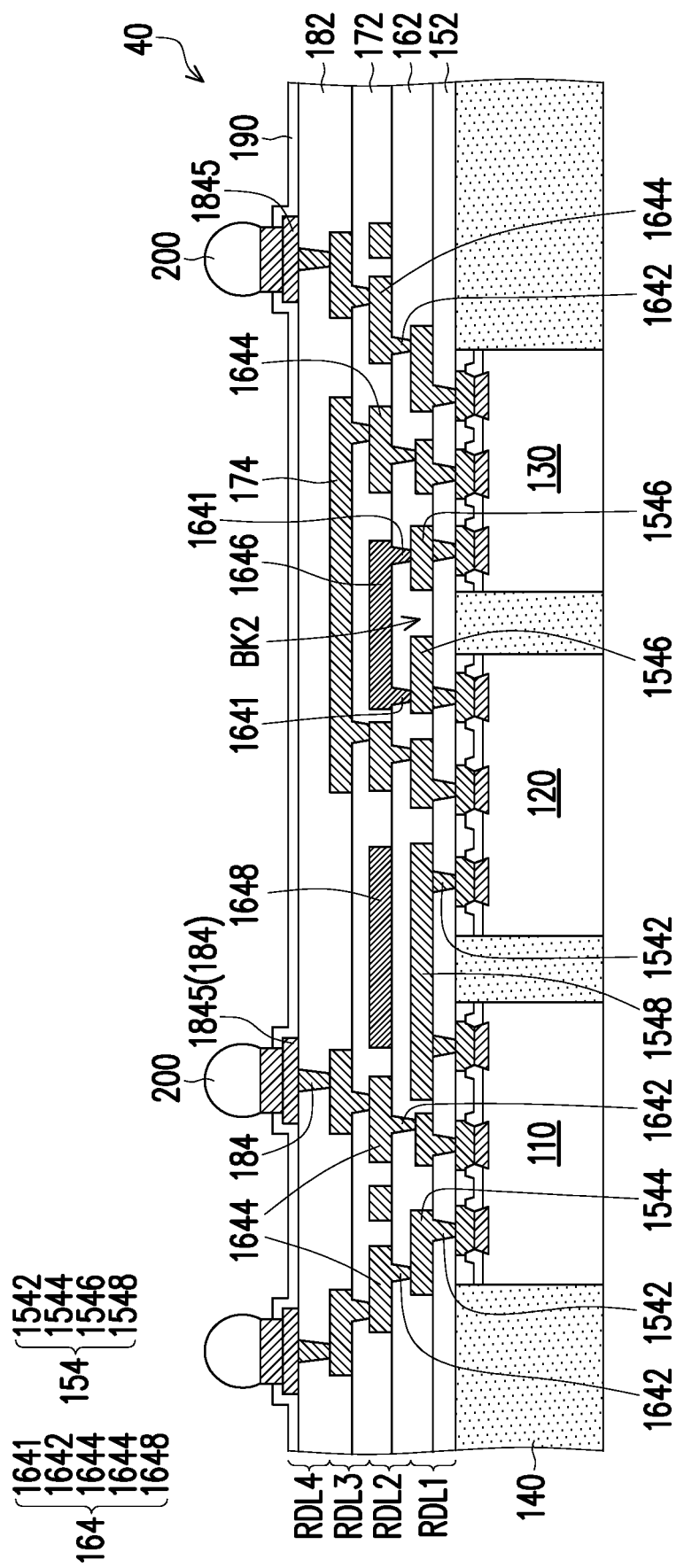

In FIG. 7, following the similar methods, the third redistribution layer RDL3 including the dielectric layer 172 and conductive patterns 174 as well as the fourth redistribution layer RDL4 including the dielectric layer 182 and conductive patterns 184 are sequentially formed on the second redistribution layer RDL2. The formation of the third and fourth redistribution layers RDL3-4 utilized substantially the same or similar materials and methods for forming the first and second redistribution layers RDL1-2, and the details are omitted herein for simplicity. In FIG. 7, the redistribution layers RDL1-4 are front-side redistribution layers and the redistribution layers RDL1-4 constitute the redistribution structure. In some embodiments, a passivation layer 190 is located on the dielectric layer 182 of the fourth redistribution layer RDL4 and covers the fourth redistribution layer RDL4 with openings exposing the underlying bump pads 184S of the conductive patterns 184 in the fourth redistribution layer RDL4. In some embodiments, conductive elements 200 are located on the exposed bump pads 184S, and are electrically and physically connected with the fourth redistribution layer RDL4. In some embodiments, the conductive elements 200 are bumps, controlled collapse chip connection (C4) bumps or ball grid array (BGA) balls. The formation of the passivation layer 190 is optional, and in other embodiments, the passivation layer 190 may be omitted. In some embodiments, the bump pads 184S of the topmost redistribution layer RDL4 may include under-ball metallurgy (UBM) layer. The layout of redistribution layers may form fan-out routings for wafer level packaging technology or for integrated fan-out (InFO) packages or package-on-package (PoP) structures. The redistribution layers as demonstrated and described in the above embodiments are applicable for various types of packages and the layout and design of the redistribution layer(s) may be adjusted based on the electrical requirements of the products.

In the above embodiments, when the signal line(s) becomes broken or damaged, the corresponding repair line (s) is formed at the next level or formed from the conductive patterns in the following redistribution layer to reconnect the broken signal line(s).

In some embodiments, the molded structure 40 may be a wafer scale package structure. In some embodiments, the molded structure 40 may maintain the wafer form and further stacked with other semiconductor devices, electronic components or sub-package units. In some embodiments, the molded structure 40 may undergo a wafer dicing process and be cut into a plurality of packages.

Figure 11B:
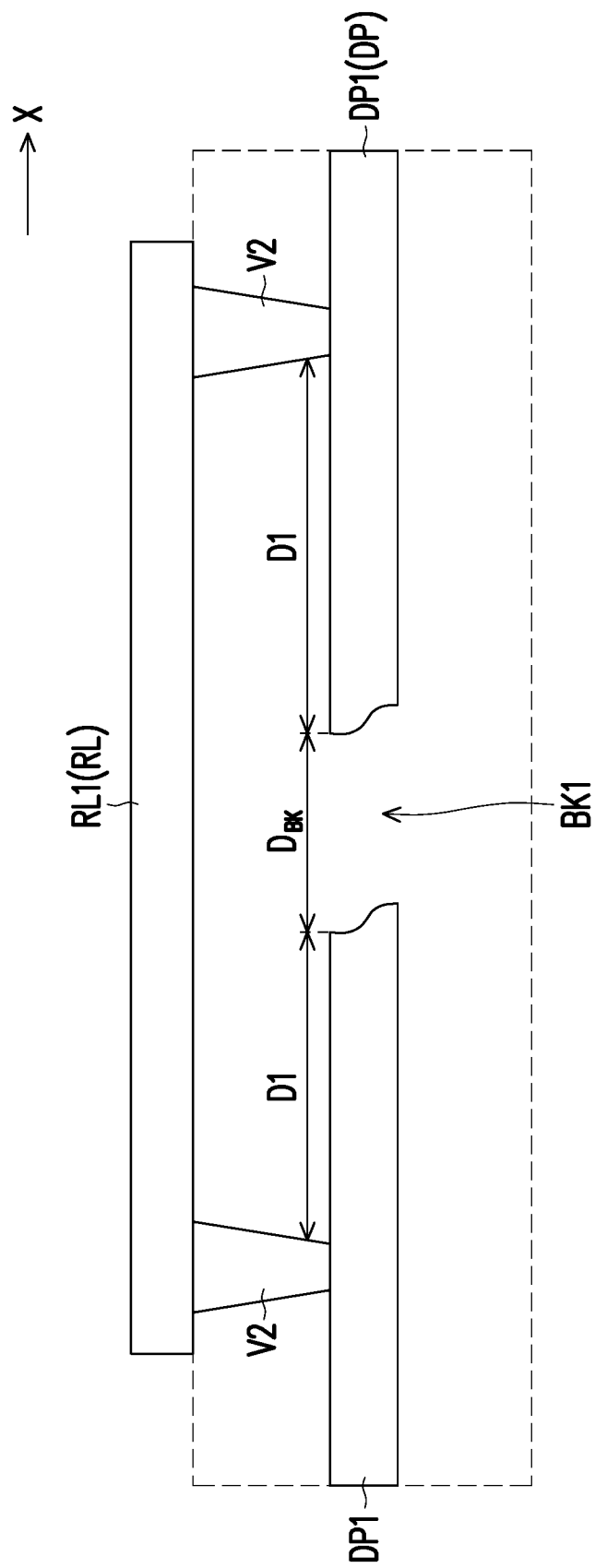
Figure 12A:
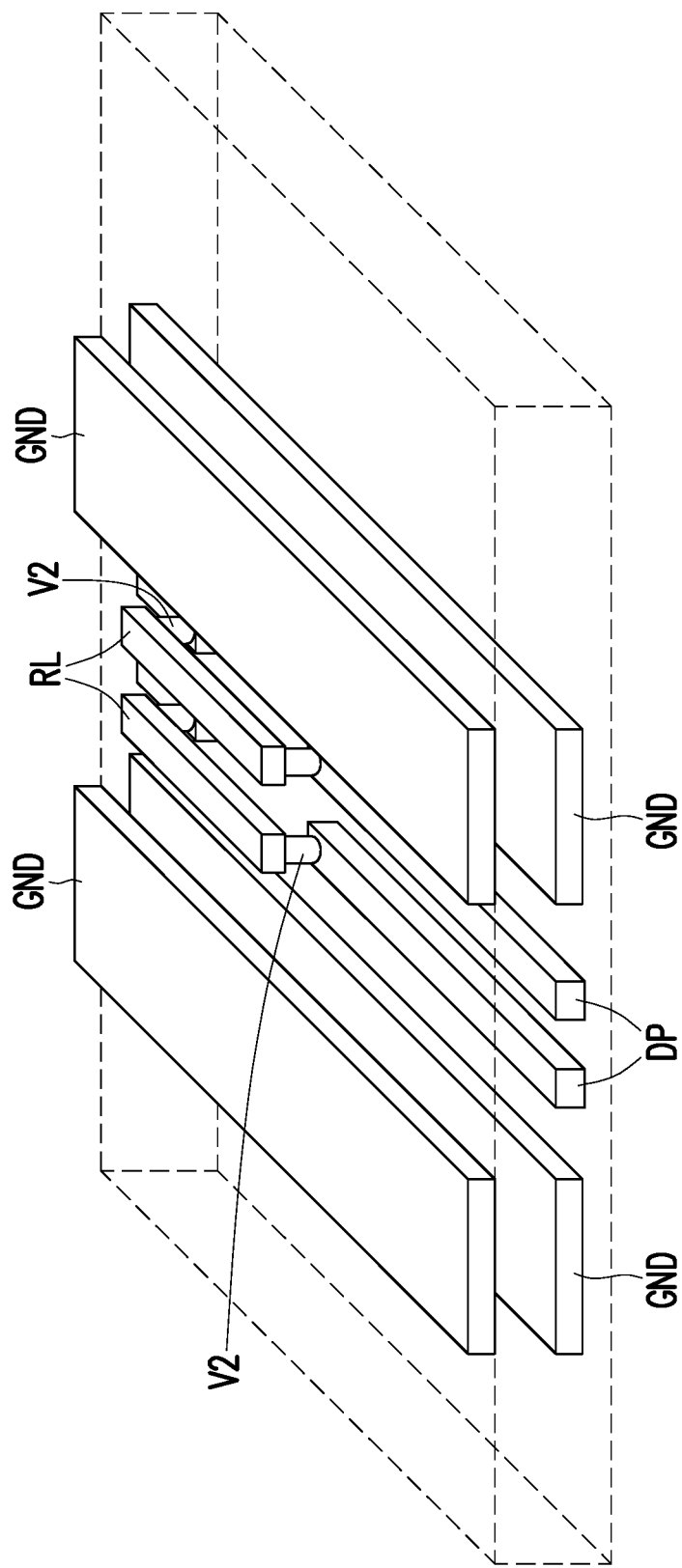
FIG. 12A and FIG. 12B respectively illustrate a schematic three-dimensional view and a cross-sectional view showing a repair structure relative to the location of the broken line(s) in accordance with some embodiments of the present disclosure.
Figure 12B:
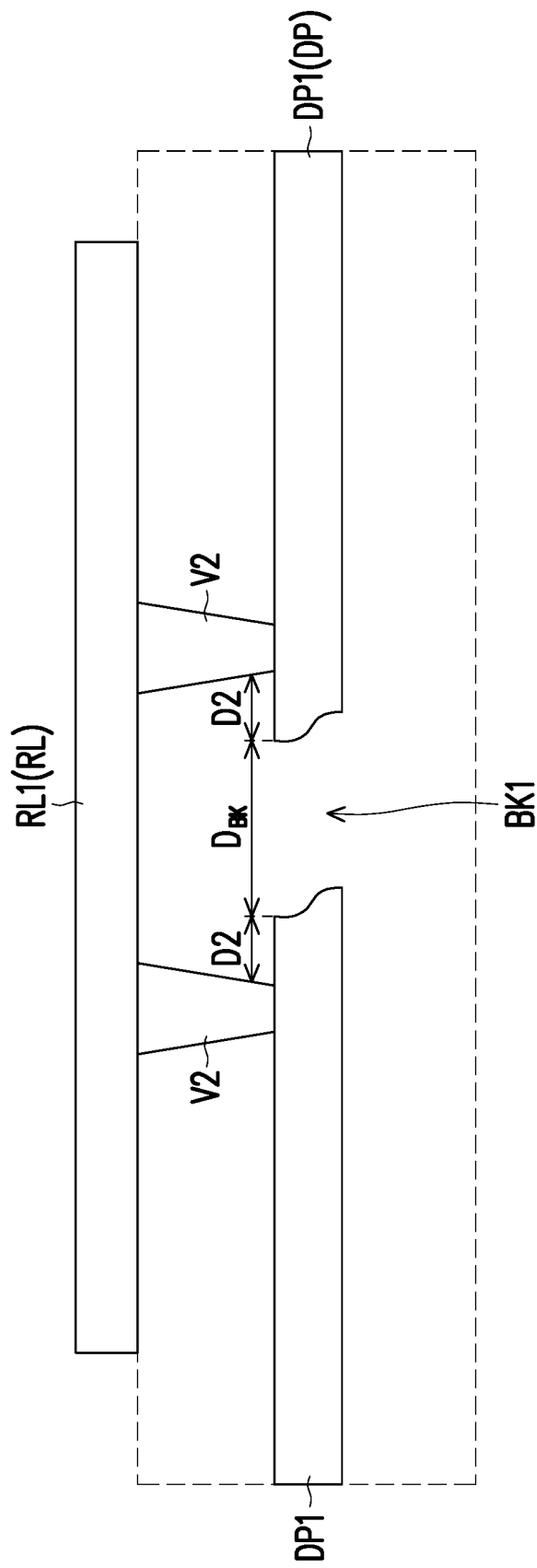

FIG. 11A and FIG. 11B respectively illustrate a schematic three-dimensional view and a cross-sectional view showing a repair structure relative to the location of the broken line(s) in accordance with some embodiments of the present disclosure. FIG. 12A and FIG. 12B respectively illustrate a schematic three-dimensional view and a cross-sectional view showing a repair structure relative to the location of the broken line(s) in accordance with some embodiments of the present disclosure.

Referring to FIG. 11A and FIG. 11B, through the vias V2 connected to the underlying separate segments of the broken signal lines of the pair of the differential pair signal lines DP, the pair of the repair lines RL electrically reconnects the broken signal lines. For example, pairs of ground planes GND are locate beside both sides of the pair of the differential pair signal lines DP as well as beside both side of the pair of the repair lines RL. In FIG. 11B, one repair line RL1 connected to one broken signal line DP1 is illustrated as an example. In some embodiments, the vias V2 located at both ending portions of the repair line RL1 are connected to the two separate segments of the broken signal line DP1 at locations away from the break BK1 with a distance D1. In one embodiment, the distance D1 is larger than the width $D_{BK}$ of the break BK1 (in the extending direction X of the signal line), and such connection type may be regarded as far ended connection. In FIG. 11B, the two vias V2 are located away from the break BK1 with the same distance D1, but it is understood that the location of either via V2 may be adjusted and the distance D1 may be varied.

In some embodiments, as shown in FIG. 12A and FIG. 12B, the vias V2 connect the pair of the repair lines RL respectively to the underlying separate segments of the broken signal lines of the pair of the differential pair signal lines DP to electrically reconnect the broken signal lines. Similarly, pairs of ground planes GND are locate beside both sides of the pair of the differential pair signal lines DP as well as beside both side of the pair of the repair lines RL. In FIG. 12B, one repair line RL1 connected to one broken signal line DP1 is illustrated as an example. In some embodiments, the vias V2 located at both ending portions of the repair line RL1 are connected to the two separate segments of the broken signal line DP1 at locations adjacent to the break BK1 with a distance D2. In one embodiment, the distance D2 is equivalent to or smaller than the width $D_{BK}$ of the break BK1 (in the extending direction X of the signal line), and such connection type may be regarded as near ended connection. In FIG. 12B, the two vias V2 are located away from the break BK1 with the same distance D2, but it is understood that the location of either via V2 may be adjusted and the distance D2 may be varied.

Through the design of the pair of the repair lines connected to the differential pair signal lines, the repair lines cause minimal impacts to the electrical properties of the reconnected signal line pairs and the reconnected signal lines structure(s) possesses low insertion loss and satisfactory electrical performance. Compared with electrical performance of the unbroken differential pair signal lines, the insertion loss for the structure of the reconnected differential pair signal lines (i.e. the repair pair connected to the broken differential pair signal lines), either the far ended connection type or near ended connection type, is reduced by about 2-3%. Furthermore, the production yield is significantly improved as there is no need to rework the whole conductive patterns.

Figure 13:
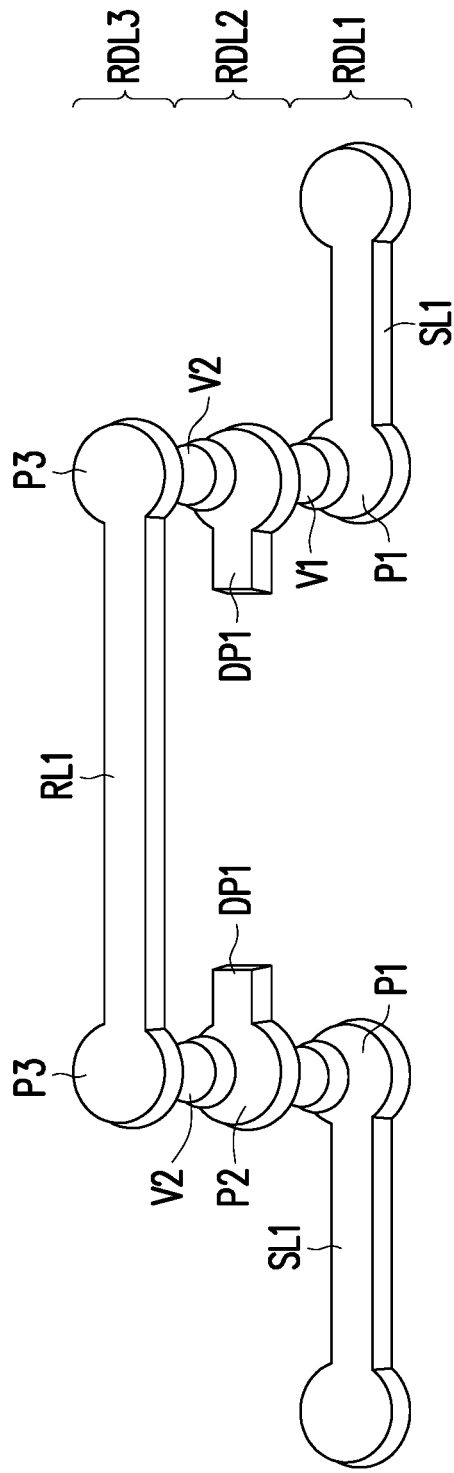
FIGS. 13-16 are schematic three-dimensional views of a repair structure relative to the locations of vias and the broken line(s) in accordance with some embodiments of the present disclosure.
Figure 14:
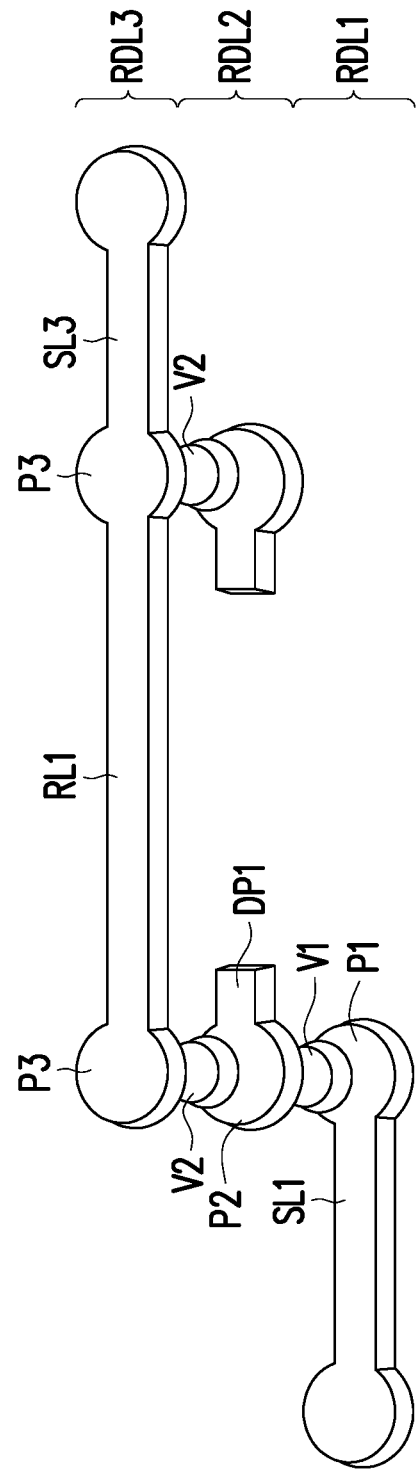

FIGS. 13-16 are schematic three-dimensional views of a repair structure relative to the locations of vias and the broken line(s) in accordance with some embodiments of the present disclosure. The differential pair signal line DP1, the signal lines SL1, SL3, the repair line RL1 and the vias V1, V2 or V2' in FIGS. 13-16 may be similar to the signal lines, the repair lines and the vias that are parts of one or more conductive patterns of several redistribution layers (RDL1-3) in a redistribution structure as described above. In FIG. 13 & FIG. 14, the signal lines SL1 in the RDL1 is connected to the broken signal line DP1 in the RDL2 through vias V1 that connect pad portions P2 (e.g. ending portions at both ends) of the broken signal line DP1 and pad portions P1 (e.g. ending portions at both ends) of the signal lines SL1. In some embodiments, the repair line RL1 (in RDL3) is connected to the broken signal line DP1 through vias V2 that respectively connect pad portions P2 of the broken signal line DP1 and pad portions P3 (e.g. ending portions at both ends) of the repair line RL1. In FIG. 13 & FIG. 14, the pad portions P1, P2, P3 are of substantially the same size and are substantially vertically aligned with one another. In FIG. 14, the signal line SL3 and the repair line RL1 share a common pad portion P3. Herein, the pad portions P1, P2, P3 are illustrated as ending portions of the lines, but the pad portions P1, P2 or P3 of the signal lines may also represent enlarged portions for accommodating the vias thereto.

Figure 15:
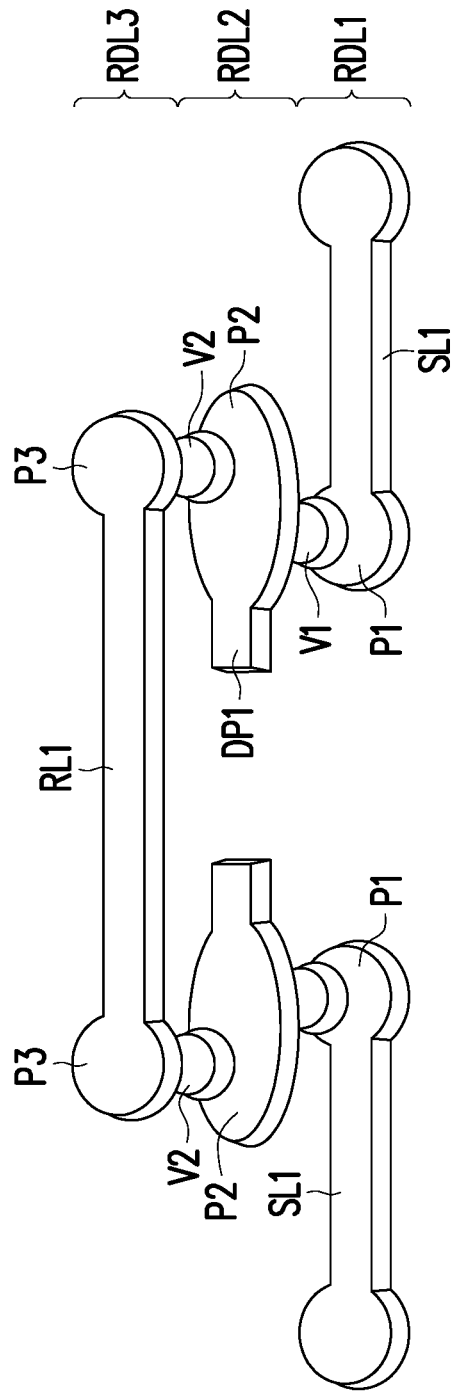
Figure 16:
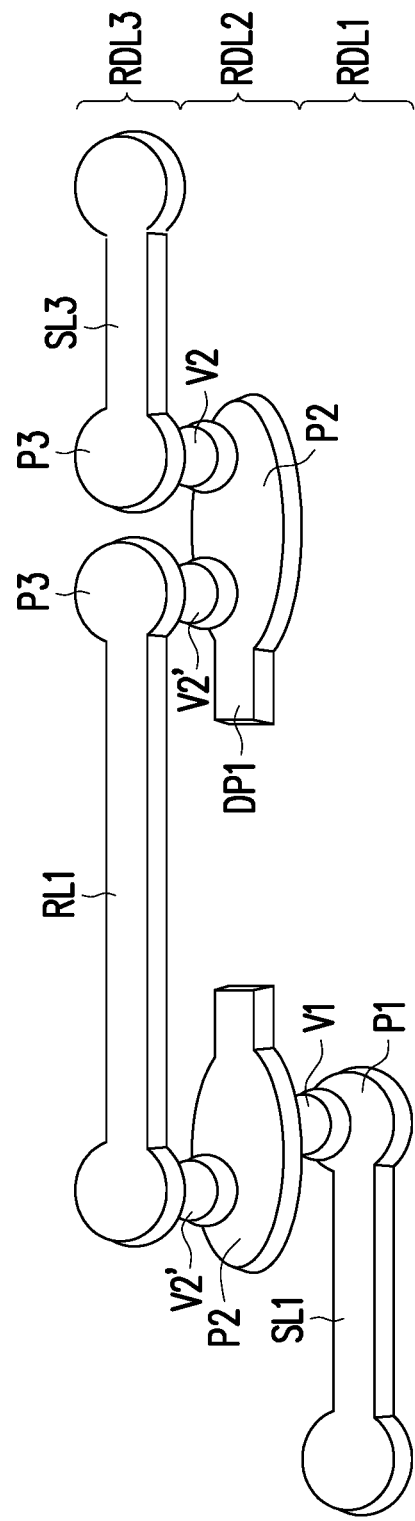

In FIG. 15 & FIG. 16, the signal line(s) SL1 in the RDL1 is connected to the broken signal line DP1 in the RDL2 through the via(s) V1 that connects pad portion(s) P2 (at both ends) of the broken signal line DP1 and pad portion(s) P1 of the signal lines SL1. In some embodiments, the repair line RL1 (in RDL3) is connected to the broken signal line DP1 through vias V2 or V2' that respectively connect pad portions P2 (at both ends) of the broken signal line DP1 and pad portions P3 of the repair line RL1. In FIG. 15 & FIG. 16, the pad portions P2 are designed to be larger (have an area larger) than the pad portions P1 or P3, and the pad portions P1, P3 are of substantially the same size. In FIG. 15, the locations of the vias V2 are not vertically aligned with the locations of the vias V1 but are offset from one another. In FIG. 16, the location of the via(s) V2' is not vertically aligned with the location of the via(s) V1 but is offset from each other. Also, in FIG. 16, the signal line SL3 and the repair line RL1 share a common pad portion P2, the signal line SL3 is connected to the pad portion P2 through the via V2, and the repair line RL1 is connected to the pad portion P2 through the via V2'.

In the present embodiments, through the formation of repair lines using the repairing process, the broken signal lines may be repaired and reconnected, and the reconnected structure offers low insertion loss and good signaling performance. By using the repairing method, the undesirable line breakage or facture can be adaptably repaired without changing the design of the photomask for mass production. The design of the pair of repair lines on the differential pair signal lines not only electrically reconnects the broken signal lines but also offers low insertion loss. With the repairing method, the performance and reliability of the signaling are enhanced and the yield of the package structures is boosted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments of the present disclosure, a package structure is provided. The package structure includes at least one semiconductor die and a redistribution structure. The semiconductor die is laterally encapsulated by an encapsulant. The redistribution structure is disposed on the at least one semiconductor and the encapsulant and electrically connected with the at least one semiconductor die. The redistribution structure includes signal lines and a pair of repair lines. The signal lines include a pair of first signal lines located at a first level, spaced apart from each other and extending in parallel, and each first signal line of the pair of first signal lines has a break that split each first signal line into separate first and second fragments. The break is located between the first and second fragments. The pair of repair lines is located above the pair of first signal lines and located right above the break. The pair of repair lines is located at a second level next to and above the first level, spaced apart from each other and extending in parallel. Opposite ending portions of each repair line of the pair of repair lines are connected with each first signal line of the pair of first signal lines through vias, and the opposite ending portions of each repair line are respectively connected with the first and second fragments with each repair line covering the break in each first signal line.

In some embodiments of the present disclosure, a structure is provided. The structure includes at least one semiconductor die laterally encapsulated by an encapsulant, and an interconnection structure. The interconnection structure is disposed on the at least one semiconductor and the encapsulant and electrically connected with the at least one semiconductor die. The interconnection structure comprises a lower level including signal lines and first ground planes and an upper level including a pair of repair lines and second ground planes. The signal lines include a pair of first signal lines spaced apart from each other and extending in parallel. The first ground planes are located alongside the pair of first signal lines. Each first signal line of the pair of first signal lines has a break that split each first signal line into separate first and second fragments, and the break is located between the first and second fragments. The pair of repair lines is located above the pair of first signal lines and located right above the break. The second ground planes are located alongside the pair of repair lines and above the first ground planes. The pair of repair lines is spaced apart from each other and extends in parallel, and each repair line of the pair of repair lines is connected with the first and second fragments through vias with each repair line covering the break in each first signal line.

In some embodiments of the present disclosure, a method for forming a package structure is described. A first semiconductor die and a second semiconductor die are disposed on a carrier. An encapsulant is formed over the carrier at least laterally encapsulating the first and second semiconductor dies. A first dielectric layer and first conductive patterns with a pair of signal lines are formed over the encapsulant and the first and second semiconductor dies. One signal line of the pair of signal lines is formed into at least two separate first fragments with a first break therebetween. A breakage process is performed to break the other signal line of the pair of signal lines into at least two separate second fragments with a second break there-between. A second dielectric layer is formed over the first conductive patterns and the first dielectric layer. A drilling process is performed to the second dielectric layer to form openings exposing portions of the at least two first fragments and portions of the at least two second fragments. A pair of repair lines is formed on the second dielectric layer, respectively connecting the at least two separate first fragments and connecting the at least two separate second fragments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
   at least one semiconductor die laterally encapsulated by an encapsulant; and
   a redistribution structure, disposed on the at least one semiconductor die and the encapsulant and electrically connected with the at least one semiconductor die, wherein the redistribution structure comprises:
      signal lines, wherein the signal lines include a pair of first signal lines located at a first level, spaced apart from each other and extending in parallel, and each first signal line of the pair of first signal lines has a break that splits each first signal line into separate first and second fragments, and the break is located between the first and second fragments; and a pair of repair lines, wherein the pair of repair lines is located above the pair of first signal lines and located right above the break, wherein the pair of repair lines is located at a second level next to and above the first level, spaced apart from each other and extending in parallel, a pair of opposite ending portions of each repair line of the pair of repair lines is connected with each first signal line of the pair of first signal lines through vias, and the pair of opposite ending portions of each repair line is respectively connected with the first and second fragments with each repair line covering the break in each first signal line.

2. The structure of claim 1, wherein each first signal line has a line width substantially equivalent to a line width of each repair line.

3. The structure of claim 1, wherein locations of the pair of repair lines are vertically aligned with locations of the pair of first signal lines and overlapped with locations of the breaks in the pair of repair lines.

4. The structure of claim 1, wherein each repair line extends from the first fragment, across the break in each first signal line and extends to the second fragment.

5. The structure of claim 1, wherein the pair of opposite ending portions of each repair line is connected to the first and second segments of each first signal line at locations away from the break with a first distance, and the first distance is larger than a width of the break.

6. The structure of claim 1, wherein the pair of opposite ending portions of each repair line is connected to the first and second segments of each first signal line at locations away from the break with a first distance, and the first distance is smaller than a width of the break.

7. The structure of claim 1, wherein the pair of opposite ending portions of each repair line is connected to the first and second segments of each first signal line at locations away from the break with a first distance, and the first distance substantially equals to a width of the break.

8. The structure of claim 1, wherein the redistribution structure further comprises a plurality of first ground planes located at the first level and besides the pair of first signal lines.

9. The structure of claim 1, wherein the redistribution structure further comprises a plurality of second ground planes located at the second level and besides the pair of repair lines.

10. A structure, comprising:
at least one semiconductor die laterally encapsulated by an encapsulant; and
an interconnection structure, disposed on the at least one semiconductor die and the encapsulant and electrically connected with the at least one semiconductor die, wherein the interconnection structure comprises:
a lower level including a plurality of signal lines and a plurality of first ground planes, wherein the plurality of signal lines includes a pair of first signal lines spaced apart from each other and extending in parallel, the plurality of first ground planes is located alongside the pair of first signal lines, and each first signal line of the pair of first signal lines has a break that splits each first signal line into separate first and second fragments, and the break is located between the first and second fragments; and
an upper level including a pair of repair lines and a plurality of second ground planes, wherein the pair of repair lines is located above the pair of first signal lines and located right above the break, and the plurality of second ground planes is located alongside the pair of repair lines and above the plurality of first ground planes, wherein the pair of repair lines is spaced apart from each other and extends in parallel, each repair line of the pair of repair lines is connected with the first and second fragments through vias with each repair line covering the break in each first signal line.

11. The structure of claim 10, wherein locations of the pair of repair lines are vertically aligned with locations of the pair of first signal lines and overlapped with locations of the breaks in the pair of repair lines.

12. The structure of claim 10, wherein each repair line extends from the first fragment, across the break in each first signal line and extends to the second fragment.

13. The structure of claim 10, wherein the vias are connected to the first and second segments of each first signal line at locations away from the break with a first distance, and the first distance is larger than a width of the break.

14. The structure of claim 10, wherein the vias are connected to the first and second segments of each first signal line at locations away from the break with a first distance, and the first distance is smaller than a width of the break.

15. A structure, comprising:
a first semiconductor die and a second semiconductor die laterally encapsulated by an encapsulant; and
an interconnection structure, disposed on the first and second semiconductor dies and the encapsulant and electrically connected with the first and second semiconductor dies, wherein the interconnection structure comprises:
a lower level including a first dielectric layer and a pair of signal lines spaced apart from each other and extending in parallel, and each signal line of the pair of signal lines has a break that splits each signal line into separate first and second fragments, and the break is located between the first and second fragments; and
an upper level including a second dielectric layer and a pair of repair lines, wherein the pair of repair lines is located above the pair of signal lines and located right above the break,
wherein the pair of repair lines is spaced apart from each other and extends in parallel, each repair line of the pair of repair lines is connected with the first and second fragments through vias with each repair line covering the break in each signal line.

16. The structure of claim 15, wherein each signal line has a line width substantially equivalent to a line width of each repair line.

17. The structure of claim 15, wherein locations of the pair of repair lines are vertically aligned with locations of the pair of signal lines and overlapped with locations of the breaks in the pair of repair lines.

18. The structure of claim 15, wherein each repair line extends from the first fragment, across the break in each signal line and extends to the second fragment.

19. The structure of claim 15, wherein the redistribution structure further comprises a plurality of first ground planes located at the lower level and besides the pair of signal lines.

20. The structure of claim 15, wherein the redistribution structure further comprises a plurality of second ground planes located at the upper level and besides the pair of repair lines.

* * * * *